United States Patent
Carlough et al.

(10) Patent No.: US 9,727,399 B1
(45) Date of Patent: Aug. 8, 2017

(54) RESIDUE-BASED CHECKING OF A SHIFT OPERATION

(71) Applicant: INTERNATIONAL BUSINESS MACHINES CORPORATION, Armonk, NY (US)

(72) Inventors: Steven R. Carlough, Poughkeepsie, NY (US); Petra Leber, Boeblingen (DE); Silvia M. Mueller, Boeblingen (DE); Andreas Wagner, Boeblingen (DE)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/279,752

(22) Filed: Sep. 29, 2016

(51) Int. Cl.
*G06F 11/00* (2006.01)
*G06F 11/07* (2006.01)

(52) U.S. Cl.
CPC ........ *G06F 11/0751* (2013.01); *G06F 11/079* (2013.01); *G06F 11/0736* (2013.01)

(58) Field of Classification Search
CPC . G06F 11/0751; G06F 11/0736; G06F 11/079
See application file for complete search history.

(56) References Cited

U.S. PATENT DOCUMENTS

| | | | | |
|---|---|---|---|---|
| 5,307,302 A * | 4/1994 | Nakano | ........... | G06F 7/5525 708/605 |
| 7,376,890 B2 | 5/2008 | Busaba et al. | | |
| 7,543,007 B2 * | 6/2009 | Iacobovici | ........... | G06F 11/10 708/209 |
| 7,769,795 B1 * | 8/2010 | Iacobovici | ........... | G06F 11/10 708/233 |
| 8,791,845 B2 * | 7/2014 | Nandi | ........... | H03M 1/0675 341/118 |
| 2007/0233773 A1 | 10/2007 | Busaba et al. | | |
| 2009/0106638 A1 * | 4/2009 | Nakase | ........... | H03M 13/091 714/807 |
| 2011/0320512 A1 | 12/2011 | Carlough et al. | | |
| 2013/0191690 A1 | 7/2013 | Busaba et al. | | |
| 2016/0019028 A1 | 1/2016 | Carlough et al. | | |
| 2016/0170829 A1 | 6/2016 | Carlough et al. | | |

OTHER PUBLICATIONS

IBM, "Power ISA™ Version 2.07B," International Business Machines Corporation, Apr. 9, 2015, pp. 1-1527.
IBM, "z/Architecture Principles of Operation," IBM™ Publication No. SA22-7832-10, Eleventh Edition, Mar. 2015, pp. 1-1732.

* cited by examiner

*Primary Examiner* — Esaw Abraham
(74) *Attorney, Agent, or Firm* — Steven Chiu, Esq.; Kevin P. Radigan, Esq.; Heslin Rothenberg Farley & Mesiti P.C.

(57) ABSTRACT

A residue-based error checking mechanism is provided for checking for error in a shift operation of a shifter. The checking includes: partitioning an input vector into the shifter into one or more bit groups of bit width W; generating a predicted residue on the input vector being shifted, the generating including masking out any bit group of bit width W fully shifted out by the shift operation from contributing to the predicted residue, and the generating accounting for any bits of a bit group of the input vector partially shifted out by the shift operation; generating a result residue on a result vector of the shift operation; and comparing the result residue with the predicted residue to check for an error in the result vector of the shift operation.

20 Claims, 6 Drawing Sheets

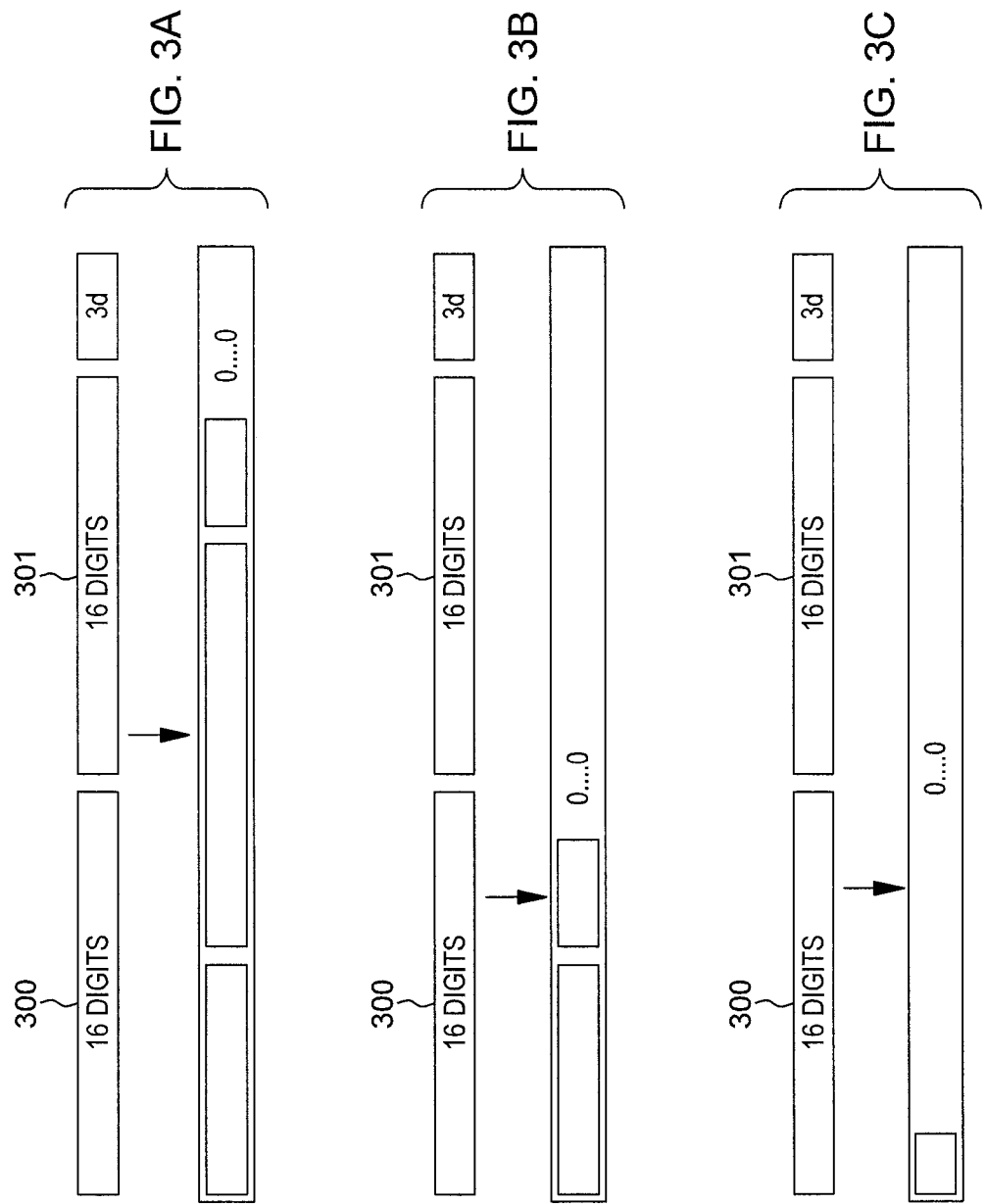

RESIDUE-BASED CHECKING OF A SHIFT OPERATION

BACKGROUND

Arithmetical circuits may include, in certain implementations, one or more shifters, such as the case in binary and decimal floating point units. An error in such mathematical circuits may occur from multiple sources, including, for instance, particles hitting the circuit, the circuit deteriorating during end of life, variation in physical design processes causing (for example) stuck-at faults, or even design bugs which are unnoticed through production.

One way to protect arithmetic logic is to model the arithmetic as well in modulo (residual) logic. However, shifters are relatively large units, and duplication or increased shifter size to support error detection incurs significant overhead.

SUMMARY

The shortcomings of the prior art are overcome and additional advantages are provided through the provision of a method which includes: checking for errors in a shift operation of a shifter. The checking includes partitioning the input vector of the shifter into one or more bit groups of bit width W, and generating a predicted residue on the input vector being shifted. The generating includes masking out any bit group of bit width W fully shifted out by the shift operation from contributing to the predicted residue, and accounting for any bits of a bit group of the input vector partially shifted out by the shift operation. The checking also includes generating a result residue on a result vector of the shift operation, and comparing the result residue with the predicted residue to check for an error in the result vector of the shift operation.

In another aspect, a device is provided which includes a shifter operable to perform a shift operation on an input vector, and a residue checker, which may be a hardware unit to check for an error in the shift operation. The residue checker partitions the input vector to the shifter into one or more bit groups of bit width W, and generates a predicted residue on the input vector being shifted. The generating includes masking out any bit group of bit width W fully shifted out by the shift operation from contributing to the predicted residue, and accounting for any bits of a bit group of the input vector partially shifted out by the shift operation. The residue checker also generates a result residue on a result vector of the shift operation, and compares the result residue with the predicted residue to check for an error in the result vector of the shift operation.

In a further aspect, a computer program product is provided for checking for error in a shift operation. The computer program product includes a computer readable storage medium having program instructions embodied therewith, the program instructions being executable by a processor to perform a method. The method includes partitioning an input vector to the shift operation into one or more bit groups of bit width W, and generating a predicted residue on the input vector being shifted. The generating includes masking out any bit group of bit width W fully shifted out by the shift operation from contributing to the predicted residue, and accounting for any bits of a bit group of the input vector partially shifted out by the shift operation. The method also includes generating a result residue on a result vector of the shift operation, and comparing the result residue with the predicted residue to check for an error in the result vector of the shift operation.

Additional features and advantages are realized through the techniques of the present invention. Other embodiments and aspects of the invention are described in detail herein and are considered a part of the claimed invention.

BRIEF DESCRIPTION OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIG. 3A illustrates one example of a shift operation of a shifter of an arithmetic logic unit circuit to undergo residue checking, in accordance with one or more aspects of the present invention;

FIG. 3B depicts another example of a shift operation of a shifter of an arithmetic logic unit circuit to undergo residue checking, in accordance with one or more aspects of the present invention;

FIG. 3C depicts a further example of a shift operation of a shifter of an arithmetic logic unit circuit to undergo residue checking, in accordance with one or more aspects of the present invention;

DETAILED DESCRIPTION

The description that follows includes exemplary devices, systems, methods, techniques and instruction sequences that embody techniques of the present invention. However, it should be understood that the described invention may be practiced, in one or more aspects, without these specific details. In other instances, well-known protocols, structures and techniques have not been shown in detail in order not to obscure the invention. Those of ordinary skill in the art will appreciate that the described techniques and mechanisms may be applied to various architectures which order values.

As noted, arithmetical circuits may include, in certain implementations, one or more shifters (for instance, shift registers or circuits), such as is the case in binary and decimal floating point units. An error in such mathematical circuits may occur from multiple sources, including, for instance, particles hitting the circuit, the circuit deteriorating towards end of life, variation in physical design processes causing, for instance, stuck-at-faults, or even design bugs which are unnoticed through production. With future technology nodes, the frequency of occurrence of errors of these types is expected to increase.

One way to protect arithmetic logic is to model the arithmetic as well as modulo (residual) logic. The mod-D residue of a number N, N mod-D, is a positive remainder resulting from the integer division of a signed integer N by an unsigned integer D (divisor). The residue of a number can be used for detecting errors in up to k bits of that number if D is a Merrill number ($D=2^k-1$). The commutative property of computing a residue over an operand, comprised of k-bit groups, allows error detection in shift results. The reason that mod-($2^k-1$) residues can be used to detect a number's bit errors is that the residue calculation uses all of the number's data bits in k-bit groups.

The residue usually employed are modulo-($2^k-1$), where k represents the number of residue bits. The ($2^k-1$) number, also known as a Merrill number, is typically employed because it is simpler to calculate modulo-($2^k-1$) of a value. The more popular residues are 2-bit (modulo-3) and 3-bit (modulo-7) residues, which have lower overhead, and are simpler to calculate. A modulo-3 residue can detect not only single-bit errors, but also many 2-bit errors. Also popular are 9-bit (modulo-9) and 15-bit (modulo-15) residues, which work well for checking decimal numbers and binary operations, respectively.

As noted, shifters may be used in a variety of arithmetic logic unit circuits, such as binary and decimal fixed point and floating point units, to perform a shift operation pursuant to a received shift amount, for instance, for operand alignment and resultant normalization.

Figure 1A:
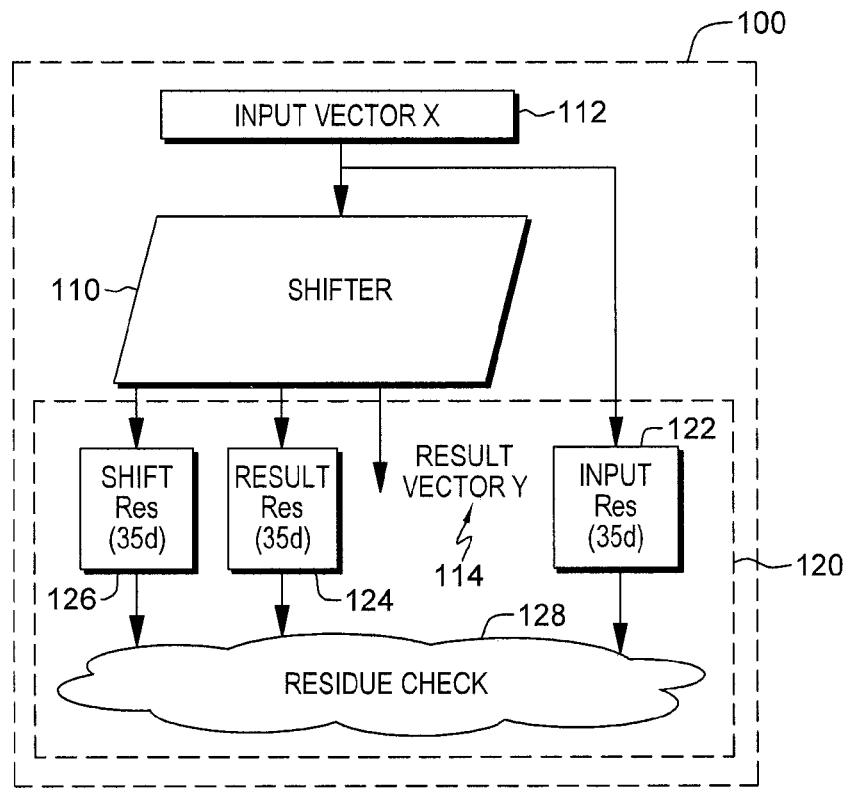
FIG. 1A depicts a partial embodiment of an arithmetic logic unit circuit with a shifter and one embodiment of residue checking a result of the shift operation.
Figure 1B:
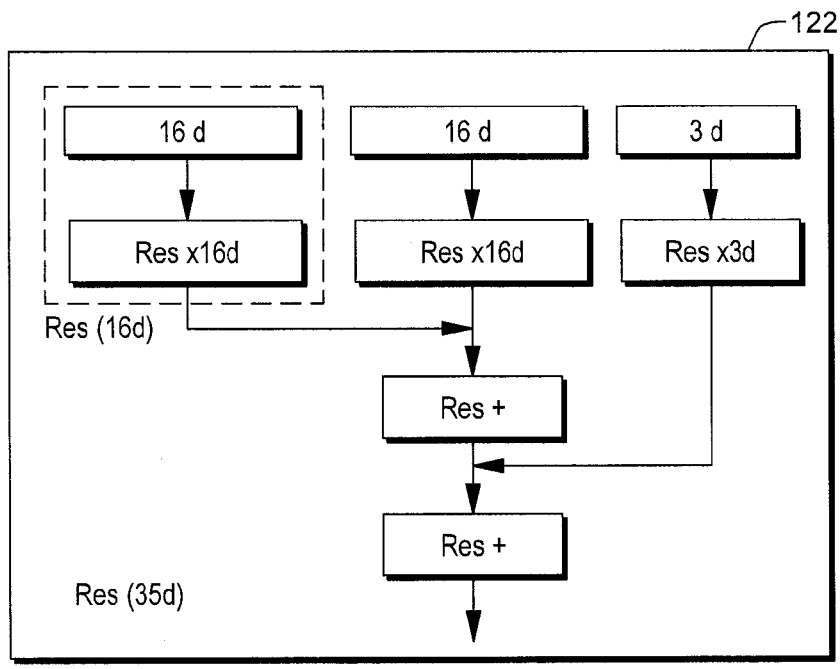
FIG. 1B is a schematic of one embodiment for generating an input residue on the input vector for the arithmetic logic unit circuit of FIG. 1A.

FIGS. 1A & 1B depict one embodiment for residue checking a shift operation within an arithmetic logic unit circuit 100. To protect a shifter 110 via residue logic 120, an input residue 122 may be generated on the input vector X 112, a result residue 124 may be generated on result vector Y 114, and a shift residue 126 may be determined on the bits which were shifted out under the received shift amount signal. For instance, assuming a left shift by a shift amount "sha", then the shifter can be protected by the residue calculation modulo r:

$$\text{Res}\_r(Y)=(\text{res}\_r(X)-\text{res}\_r(Y))*\text{sha}$$

Where the multiply is also done modulo r.

For binary logic, residue 3 may be used for low coverage, and residue 15 for high coverage. For decimal arithmetic, residue 3 may be used for low coverage, and residue 9 for high coverage. In the following example, residue 3 is assumed. Note that bits with weight 4 or higher of the shift amount, have an impact on the bits being shifted out, but since 4=1 modulo-3, they do not need to be considered for the multiply:

$$\text{res3}(Y)=\text{mod }3(\text{res3}(X)-(\text{res3}(Y))*\text{sha}(1:0)$$

To implement the residue checking of FIGS. 1A & 1B, 3× the full width of the input vector X is required. One embodiment of this is illustrated in FIG. 1A, where input vector X is assumed, by way of example, to be 35-digits wide, and the input residue logic 122, shift residue logic 126, and result residue logic 124 are also each 35-digits wide. Note that the input residue logic 122 and shift residue logic 126 are each 35-digits wide in this example to account for, for example, no digits being shifted out, or all digits being shifted out, by shifter 110 pursuant to the received shift amount. Residue checking 128 may include comparing the result residue 124 with the difference between the input residue 122 and shift residue 126 to check for an error in result vector 114 of the shift operation.

FIG. 1B depicts one example of input residue logic 122 for a 35-digit (140-bit) left shifter used in, for instance, a decimal floating point unit. As illustrated in FIG. 1B, one possible split is to divide the input vector X into two groups of 16-digits and one of 3-digits with, for instance, the residue of the left-most 16-digits (Res(16d)) being added to the residue of the next 16-digits (Res(16d)), and the summed residue (Res(32d)) being further combined with the residue from the remaining 3 digits to achieve an input residue of 35-digits (Res(35d)).

One issue addressed herein is how to more efficiently protect a shifter, so that good coverage is attained, but with as little extra hardware within the residue logic as possible. Disclosed hereinbelow is, in part, the concept of reducing the residual logic hardware by applying the shift amount obtained as a type of select function into the residue generation logic.

Figure 2A:
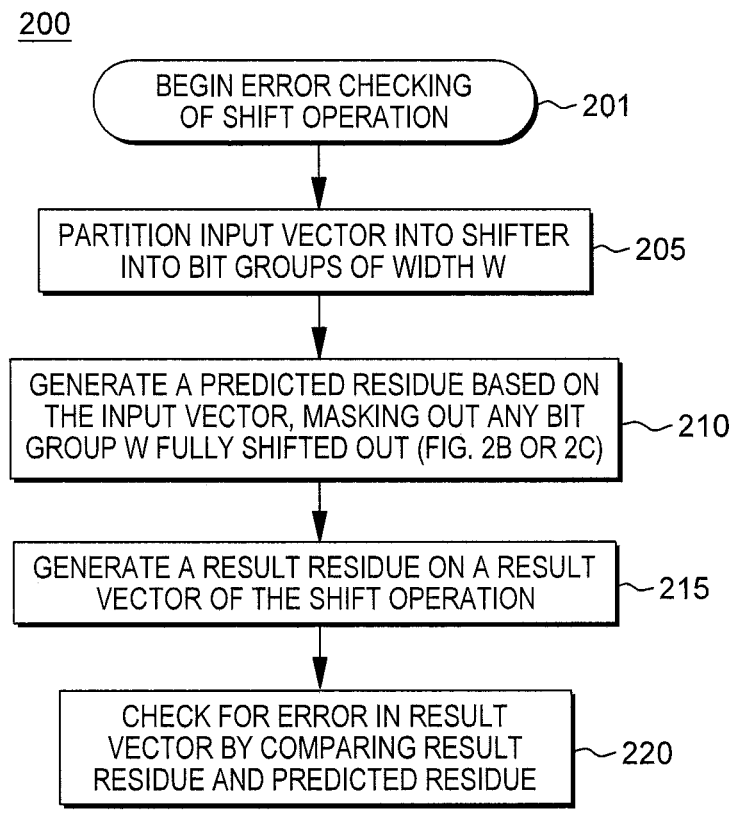
FIG. 2A depicts one embodiment of a process for error-checking a shift operation, in accordance with one or more aspects of the present invention.
Figure 2B:
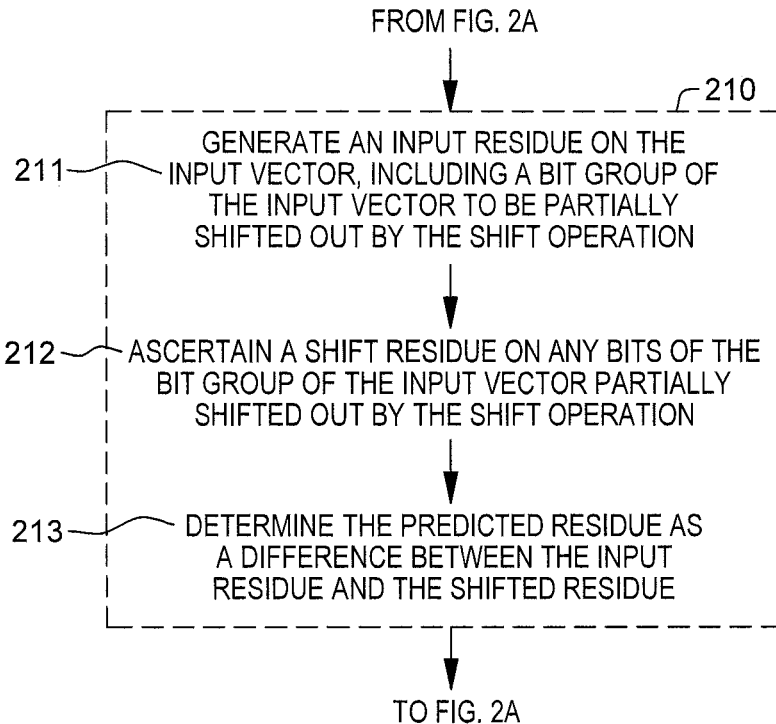
FIG. 2B depicts one embodiment of a process for generating a predicted residue based on the input vector, in accordance with one or more aspects of the present invention.
Figure 2C:
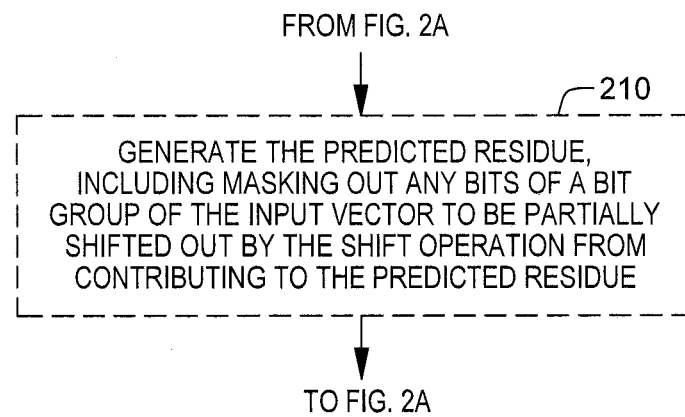
FIG. 2C depicts one embodiment of a further process for generating a predicted residue based on the input vector, in accordance with one or more aspects of the present invention.

Generally stated, referring to FIGS. 2A-2C, an enhanced method, device and computer program product are provided herein for facilitating checking for error of a shift operation of a shifter using residue checking.

As illustrated in FIG. 2A, upon beginning error checking of a shift operation 201, the input vector (or value) into the shifter is partitioned into bit groups of width W, wherein W may be any desired value of 2-bits or more. For instance, where the shifter is a radius-K shifter, the bit width W may be a power of K for the radius-K shifter. Note that bit groups and digit groups may be used interchangeably herein with, in one example, a digit being 4-bits wide in a binary-coded decimal implementation.

A predicted residue is generated on the input vector being shifted. In accordance with one or more aspects of the present invention, the predicted residue is based on the input vector, masking out (for instance, using the received shift amount "sha") any bit group W fully shifted out by the shift operation from contributing to the predicted residue 210. Generating of the predicted residue may also account for any bits of a bit group of the input vector partially shifted out by the shift operation. Two different approaches to accounting for or addressing partially shifted out bits of a bit group in the generating of the predicted residue are illustrated in FIGS. 2B & 2C.

Referring first to FIG. 2B, generating the predicted residue on the input vector 210 may further include, in part: generating an input residue on the input vector being shifted, including on a bit group of the input vector partially shifted out by the shift operation 211 (but not including any fully shifted out bit group); ascertaining a shift residue on any bits of the bit group of the input vector partially shifted out by the shift operation 212; and determining the predicted residue as a difference between the input residue and the shift residue 213. Note in this regard that ascertaining the shift residue may include generating a zero shift residue where there is no bit group of the input vector partially shifted out by the shift operation.

In the case of FIG. 2C, generating the predicted residue on the input vector 210 further includes masking out (for instance, using the received shift amount) any bits of a bit group of the input vector partially shifted out by the shift operation from contributing to the predicted residue. Note that this masking would be in combination with masking out any bit group W fully shifted out, as noted above with respect to FIG. 2A.

Continuing with the error checking process of FIG. 2A, in addition to generating the predicted residue as outlined above, the checking logic also generates a result residue on a result vector of the shift operation 215, and checks for error in the result vector by comparing the result residue and the predicted residue 220.

FIGS. 3A-3C depict example operation of a digit-based left shifter using an error checking process such as described herein.

In FIG. 3A, a 35-digit input vector X is again assumed (by way of example only). The input vector in this case is partitioned or divided into two bit groups of bit width W, each 16-digits wide, with the remaining bit group being 3-digits wide. In FIG. 3A, only the left-most bit group 300 is partially shifted out. Thus, it suffices to compute the shift residue only on the partially shifted bit group 300, which is at most, 16-digits wide.

As illustrated in FIG. 3B, assuming that the shift amount is greater than or equal to 16-digits, and less than 32-digits, then the left-most bit group 300 is fully shifted out, and the next bit group 301 may be partially shifted out. In this case, the input residue is computed on that portion of the input vector which remains, as well as the portion of the partially shifted out bit group 301. This may be performed by masking out the fully shifted bit group 300. For the shift residue, only the shifted out digits of the bit group 301 which is partially shifted out are considered, which again, is at most 16-digits.

In this example of FIG. 3C, it is assumed that 32-digits or more are shifted out. In this case, since both bit groups 300, 301 are fully shifted out, they are masked out from consideration in generating the input residue on the input vector, and in the shift residue, only those bits of the remaining 3 digits which are shifted out, are considered.

As can be seen from the above discussion, the error checking process described herein advantageously partitions the input vector into bit groups from left-to-right in the case of a left shifter, or right-to-left in the case of a right shifter. For instance, in a binary shifter, the bit groups may be partitioned based on powers of 2, and in a trinary shifter, the bit groups may be partitioned based on powers of 3. Note that the last bit group may only be partially used, and not have a full bit width W (as in the 35-digit vector example above).

Bit groups shifted out need not be included in the input residue calculation on input vector X, and need not be included in the shift residue determination. The bit group which is partially shifted out, of which there is only one, is included in the input residue calculation based on input vector X, and the shift residue is ascertained on any bits of that bit group of the input vector partially shifted out by the shift operation.

Figure 4A:
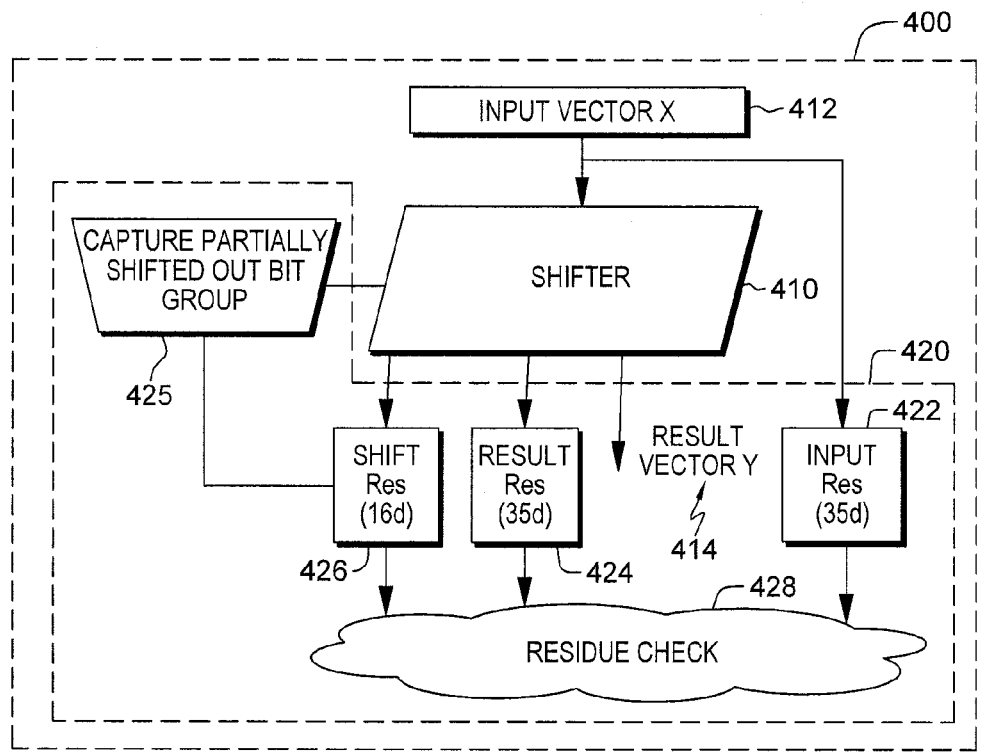
FIG. 4A depicts an alternate embodiment of an arithmetic logic unit circuit with error-checking, in accordance with one or more aspects of the present invention.
Figure 4B:
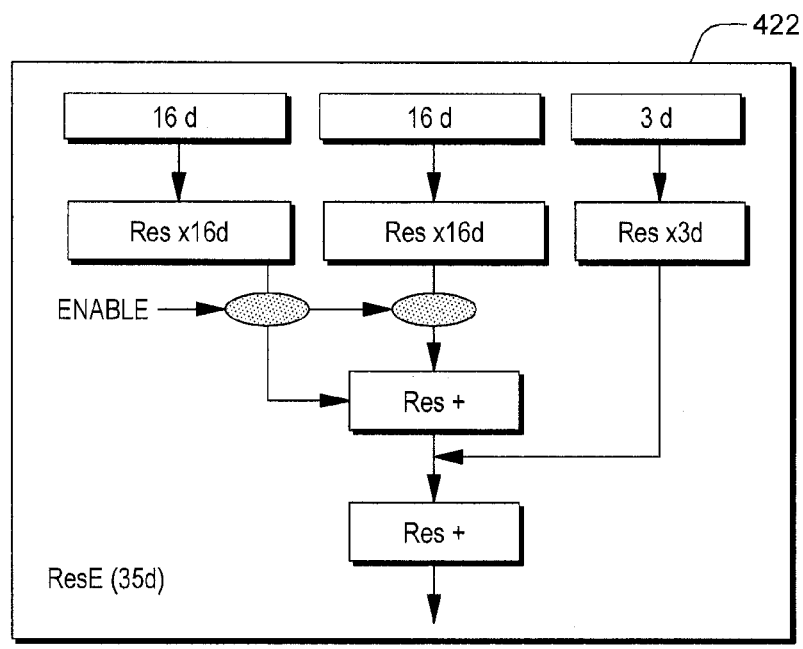
FIG. 4B is a schematic of one embodiment for generating an input residue on the input vector, in accordance with one or more aspects of the present invention.

FIGS. 4A & 4B depicts one example of an arithmetic logic unit circuit 400 (FIG. 4A) with error checking, in accordance with the above discussion of the present invention.

Referring to FIG. 4A, arithmetic logic unit circuit 400 includes a shifter 410 and a residue checker 420. In one example, residue checker 420 is a hardware logic circuit implemented as described herein for checking for error of a shift operation of shifter 410. Shifter 410 is, in one example, a left shifter which (under a received shift amount signal) shifts input vector X 412 to provide result vector Y. In this example, residue check 420 includes input residue logic 422, result residue logic 424, capture logic 425 to capture a partially shifted out bit group, and shift residue logic 426, as well as a residue check for comparison of the generated residues 428. Advantageously, as illustrated in FIG. 4A, shift residue logic 426 need only be 16-digits wide (16d) in this example, as discussed above in connection with FIGS. 3A-3C. One embodiment of input residue logic 422 is depicted in FIG. 4B.

As illustrated in FIG. 4B, input residue logic 422 may again include logic for determining residue of the partitioned bit groups of bit width W, which in this case are 16-digits wide. In the 35-digit example, the first residue outputs for the bit groups of 16-digits may have respective enable logic associated therewith (as shown) to allow for masking out of any bit group fully shifted out by the shift operation, as noted above.

Those skilled in the art of arithmetic logic will understand further how to implement the processes described herein based on the description provided. For instance, the check logic or process described could be implemented with smaller bit groups of width W. For instance, in a 35-digit example, 4×8 digits+3 digits could be employed. When the input width is other than a power of 2, then the "remainder" of the digits not completely filling a bit group remain to the right in a left-shifter implementation. The concepts presented herein are also applicable to right-shifters, with the remaining bits not completely filling a bit group being to the left, in that example. The concepts described may also be applied to barrel shifter, stand-alone shifters, as well as to shifters inside more complex units, such as binary and decimal floating point units. For both kinds of binary units, the arithmetical logic circuit begins with shifters. Since there is arithmetic after the shifter, the calculations of the result residue may be dropped when expressing the residue of the final answer, and not checking intermediate values such as the shift amount.

A residue protected shifter and residue checking process are described herein, configured to either perform a right or left shift on a received input vector or value under a received shift amount signal. The residue protected shifter produces a shift amount, and a result vector, as well as a result residue and predicted residue, with the predicted residue being (in one example) determined by a difference between an input residue and a shift residue. In accordance with the processes described herein, the input vector is partitioned into bit groups of width W, where W may be a power of k for a radius-k shifter. In the predicted residue generation for input vector X, bit groups which are fully shifted out are masked out to not contribute to the predicted residue. In the shift residue generation, used in certain cases to determine the predicted residue, only the bit group which is partially shifted out is captured and used to determine the shift residue. In the result residue generation of the result vector, the full vector is used. For detecting a residue error, the result residue is compared against the predicted residue, which as noted, in one implementation, may be ascertained by determining the difference between the input residue and the shift residue. For an input and result vector or value width of N, the correction vector may be generated by a shifter with an input width N and a result width N+W. For an input and result width of N, the correction vector may be generated by generating a W-bit wide mask using a half decoder on the least significant bits of the shift amount, selecting the partially shifted out bit group based on the leading bits of the shift amount and ANDing the result with the mask.

Figure 5:
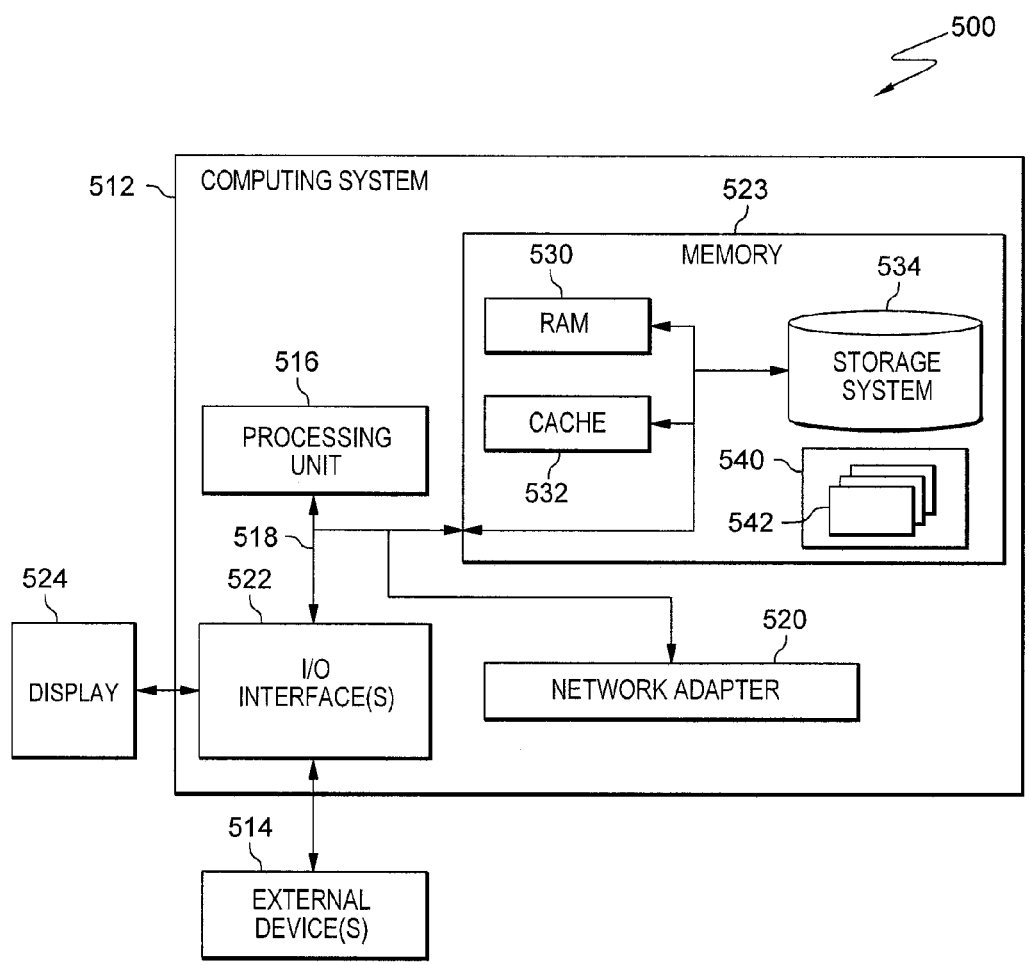
FIG. 5 is a block diagram of one embodiment of a data processing system which may implement one or more aspects of error checking, in accordance with one or more aspects of the present invention.

Referring to FIG. 5, a block diagram of a data processing system is shown in which illustrative aspects of the present invention may be implemented.

As shown, data processing system 500 includes a computing system 512. Examples of well-known computing systems, environments, and/or configurations that may be suitable for use with computer system 512 include, but are not limited to, a workstation, a computer, a server, and the like.

Computing system 512 may be described in the general context of computer system-executable instructions, such as program modules, being executed by a computer system. Generally, program modules may include routines, programs, objects, components, logic, data structures, and so on that perform particular tasks or implement particular abstract data types.

As depicted in FIG. 5, computing system 512, is shown in the form of a general-purpose computing device. The components of computing system 512 may include, but are not limited to, one or more processors or processing units 516, a system memory 523, and a bus 518 that couples various system components including system memory 523 to processor 516.

In one embodiment, processor 516 may be based on the z/Architecture® offered by International Business Machines Corporation, or other architectures offered by International Business Machines Corporation or other companies. z/Architecture® is a registered trademark of International Business Machines Corporation, Armonk, N.Y., USA. One embodiment of the z/Architecture® is described in "z/Architecture® Principles of Operation," IBM Publication No. SA22-7832-10, March 2015, which is hereby incorporated herein by reference in its entirety.

In other examples, it may be based on other architectures, such as the Power Architecture offered by International Business Machines Corporation. One embodiment of the Power Architecture is described in "Power ISA™ Version 2.07B," International Business Machines Corporation, Apr. 9, 2015, which is hereby incorporated herein by reference in its entirety. POWER ARCHITECTURE is a registered trademark of International Business Machines Corporation, Armonk, N.Y., USA. Other names used herein may be registered trademarks, trademarks, or product names of International Business Machines Corporation or other companies.

Bus 518 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

Computing system 512 may include a variety of computer system readable media. Such media may be any available media that is accessible by computing system 512, and it includes both volatile and non-volatile media, removable and non-removable media.

System memory 523 can include computer system readable media in the form of volatile memory, such as random access memory (RAM) 530 and/or cache memory 532. Computing system 512 may further include other removable/non-removable, volatile/non-volatile computer system storage media. By way of example only, storage system 534 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media could be provided. In such instances, each can be connected to bus 518 by one or more data media interfaces. As described below, memory 523 may include at least one program product having a set (e.g., at least one) of program modules that are configured to carry out the functions of embodiments of the invention.

Program/utility 540, having a set (at least one) of program modules 542, may be stored in memory 532 by way of example, and not limitation, as well as an operating system, one or more application programs, other program modules, and program data. Each of the operating system, one or more application programs, other program modules, and program data or some combination thereof, may include an implementation of a networking environment. Program modules 542 generally carry out the functions and/or methodologies of embodiments of the invention as described herein. Alternatively, a separate, website security tracking system, module, logic, etc., 201 may be provided within computing environment 512.

Computing system 512 may also communicate with one or more external devices 514 such as a keyboard, a pointing device, a display 524, etc.; one or more devices that enable a user to interact with computing system 512; and/or any devices (e.g., network card, modem, etc.) that enable computing system 512 to communicate with one or more other computing devices. Such communication can occur via Input/Output (I/O) interfaces 522. Still yet, computing system 512 can communicate with one or more networks such as a local area network (LAN), a general wide area network (WAN), and/or a public network (e.g., the Internet) via network adapter 520. As depicted, network adapter 520 communicates with the other components of computing system, 512, via bus 518. It should be understood that although not shown, other hardware and/or software components could be used in conjunction with computing system 512. Examples, include, but are not limited to: microcode, device drivers, redundant processing units, external disk drive arrays, RAID systems, tape drives, and data archival storage systems, etc.

Those skilled in the art should note that the depicted system examples of FIG. 5, as well as other examples referenced herein, are not meant to imply architectural limitations.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
   protecting a shifter with a residue checker which:
      partitions an input vector into the shifter into one or more bit groups of bit width W;
      generates a predicted residue on the input vector being shifted, the generates including masking out any bit group of bit width W fully shifted out by the shift operation from contributing to the predicted residue, and the generates accounting for any bits of a bit group of the input vector partially shifted out by the shift operation;
      generates a result residue on a result vector of the shift operation; and
      compares the result residue with the predicted residue to confirm operation of the shifter by checking for absence of error in the result vector of the shift operation.

2. The method of claim 1, wherein generating the predicted residue on the input vector comprises:
   generating an input residue on the input vector, including a bit group of the input vector to be partially shifted out by the shift operation;
   ascertaining a shift residue on any bits of the bit group of the input vector partially shifted out by the shift operation; and
   determining the predicted residue as a difference between the input residue and the shift residue.

3. The method of claim 2, wherein the ascertaining comprises masking out bits of any bit group of bit width W fully shifted out by the shift operation from contributing to the shift residue.

4. The method of claim 2, wherein the ascertaining comprises generating a zero shift residue where there is no bit group of the input vector partially shifted out by the shift operation.

5. The method of claim 1, wherein generating the predicted residue further comprises masking out any bits of a bit group of the input vector to be partially shifted out by the shift operation from contributing to the predicted residue.

6. The method of claim 1, wherein the shifter is a radix-K shifter, and the bit width W is a multiple of 4.

7. The method of claim 6, wherein the radix-K shifter is a shifter selected from the group consisting of a binary shifter (K=2), a decimal shifter (K=10), and a hex shifter (K=16).

8. The method of claim 1, wherein each bit group of the one or more bit groups of bit width W of the partitioned input vector comprises consecutive bits of the input vector.

9. The method of claim 1, further comprising reporting the error based on the comparing indicating other than an equal result.

10. A device comprising:
    a shifter operable to perform a shift operation on an input vector; and
    a residue checker associated with the shifter to protect the shifter, the residue checker being a hardware unit which confirms operation of the shifter by checking for absence of error in the shift operation, the residue checker:
       partitioning the input vector to the shifter into one or more bit groups of bit width W;
       generating a predicted residue on the input vector being shifted, the generating including masking out any bit group of bit width W fully shifted out by the shift operation from contributing to the predicted residue, and the generating accounting for any bits of a bit group of the input vector partially shifted out by the shift operation;
       generating a result residue on a result vector of the shift operation; and
       comparing the result residue with the predicted residue to confirm operation of the shifter by checking for absence of an error in the result vector of the shift operation.

11. The device of claim 10, wherein generating the predicted residue on the input vector comprises:
    generating an input residue on the input vector, including a bit group of the input vector to be partially shifted out by the shift operation;
    ascertaining a shift residue on any bits of the bit group of the input vector partially shifted out by the shift operation; and
    determining the predicted residue as a difference between the input residue and the shift residue.

12. The device of claim 11, wherein the ascertaining comprises masking out bits of any bit group of bit width W fully shifted out by the shift operation from contributing to the shift residue.

13. The device of claim 11, wherein the ascertaining comprises generating a zero shift residue where there is no bit group of the input vector partially shifted out by the shift operation.

14. The device of claim 10, wherein generating the predicted residue further comprises masking out any bits of a bit group of the input vector to be partially shifted out by the shift operation from contributing to the predicted residue.

15. The device of claim 10, wherein the shifter is a radix-K shifter, and the bit width W is a multiple of 4.

16. The device of claim 15, wherein the radix-K shifter is a shifter selected from the group consisting of a binary shifter (K=2), a decimal shifter (K=10), and a hex shifter (K=16).

17. A computer program product for protecting a shifter with a residue checker, the computer program product comprising:
    a computer readable storage medium having program instructions embodied therewith, the program instructions being executable by a processor to perform a residue checking method comprising:
       partitioning an input vector to the shift operation into one or more bit groups of bit width W;

generating a predicted residue on the input vector being shifted, the generating including masking out any bit group of bit width W fully shifted out by the shift operation from contributing to the predicted residue, and the generating accounting for any bits of a bit group of the input vector partially shifted out by the shift operation;

generating a result residue on a result vector of the shift operation; and comparing the result residue with the predicted residue to confirm operation of the shifter by checking for absence of error in the result vector of the shift operation.

18. The computer program product of claim 17, wherein generating the predicted residue on the input vector comprises:

generating an input residue on the input vector, including a bit group of the input vector to be partially shifted out by the shift operation;

ascertaining a shift residue on any bits of the bit group of the input vector partially shifted out by the shift operation; and determining the predicted residue as a difference between the input residue and the shift residue.

19. The computer program product of claim 18, wherein the ascertaining comprises masking out bits of any bit group of bit width W fully shifted out by the shift operation from contributing to the shift residue.

20. The computer program product of claim 17, wherein generating the predicted residue further comprises masking out any bits of a bit group of the input vector to be partially shifted out by the shift operation from contributing to the predicted residue.

* * * * *